United States Patent [19]

Mashiko et al.

[11] 4,333,168
[45] Jun. 1, 1982

[54] MEMORY CIRCUIT

[75] Inventors: Koichiro Mashiko; Toshio Ichiyama; Makoto Taniguchi, all of Itami, Japan

[73] Assignee: Mitsubishi Denki Kabushiki Kaisha, Tokyo, Japan

[21] Appl. No.: 176,638

[22] Filed: Aug. 8, 1980

[30] Foreign Application Priority Data

Aug. 8, 1979 [JP] Japan .................................. 54-101980

[51] Int. Cl.³ ............................................. G11C 11/40
[52] U.S. Cl. ..................................... 365/210; 365/184
[58] Field of Search ........................ 365/174, 182, 210

[56] References Cited

U.S. PATENT DOCUMENTS 4,270,190 5/1981 Jindra et al. ........................ 365/210

Primary Examiner—Terrell W. Fears

Attorney, Agent, or Firm—Wenderoth, Lind & Ponack

[57] ABSTRACT

A plurality of single transistor memory cells with electrically charged capacitors and two similar dummy memory cells are electrically coupled in symmetric relationship to a sense amplifier for each row of the disclosed memory circuit. An address signal selects a word line connected to the memory cell on one side of the amplifier and a dummy word line connected to the dummy memory cell on its other side and applies a word signal to the selected word lines, in order to read out electric charges on the capacitors, and the amplifier amplifies a potential difference due to the read charges. For each row two dummy word lines are connected to delay means coupled to the amplifier to form an activating signal for the amplifier by delaying a potential rise developed on the selected dummy word line.

2 Claims, 2 Drawing Figures

MEMORY CIRCUIT

BACKGROUND OF THE INVENTION

This invention relates to a memory circuit, and more particularly to a circuit for generating a signal for activating a memory sense amplifier.

There are well known memory circuits including the single transistor type memory cell including a field effect transistor and a data storing capacitor connected serially thereto. Such a memory circuit has comprised a plurality of single transistor type memory cells arranged in rows and columns and a pair of dummy memory cells similar in construction to the memory cells and disposed in each row. For each row, the memory cells and the pair of dummy memory cells are connected in symmetrical relationship to a sense amplifier through a true bit line on the one side of the sense amplifier and a complementary bit line on the other side thereof. Further, the memory cells in each column are connected to a common word line and the dummy memory cells located on each side of the sense amplifier are connected to a common dummy word line. The word lines and dummy word lines are connected to a column decoder subsequently connected to a word line-drive generator. The column decoder is responsive to an address signal externally applied thereto to select the word line as determined by the address signal and that dummy word line located on that side of the sense amplifier remote from the selected word line. The address signal is also applied to the word line-drive generator to generate a signal for driving a word line. That signal is applied via the column decoder to the selected word line and dummy word line whereby potentials are developed on those lines until data stored on the associated capacitors are read out on the true and complementary bit lines respectively.

At that time the word line-drive generator responds to the address signal to generate an activating signal for the sense amplifier as determined by the address signal and apply it to that sense amplifier through an associated activation circuit including a series combination of a resistor, a delay circuit and another delay circuit. The sense amplifier selected by the address signal amplifies a potential difference between potentials developed on the mating bit lines in response to the activating signal applied thereto.

However each of the word lines and dummy word lines includes a parasitic resistance and a parasitic capacitance having high magnitudes so that the rise of the potentials in the selected word line and dummy word line are fairly delayed with respect to that of the word line-drive signal and has a gentle slope as compared with the latter signal. Therefore it has been difficult to determine a level at which the associated capacitors are read out on the true and complementary bit lines. In order to avoid this difficulty, the resistor has been connected in the activation circuit to optimalize a timing of activation of the sense amplifier. Alternatively the two delay circuits might be strictly designed and constructed without the resistor. This has attended with troublesome jobs. Also conventional memory circuits such as described above have disadvantageously required large-sized semiconductor chips and been easily affected by a variation in manufacturing process.

Accordingly it is an object of the present invention to provide an improved memory circuit including a sense amplifier capable of being easily activated at the optimum timing and prevented from malfunctioning due to a variation in manufacturing process without increasing an area of a semiconductor chip involved.

SUMMARY OF THE INVENTION

The present invention provides a memory circuit comprising a plurality of single transistor type memory cells arranged in rows and columns, each including a memory capacitor having an electric charge stored thereon, a pair of dummy memory cell identical in construction to the memory cells for each row, and, a pair of true and complementary bit lines connected to said sense amplifier for each row. The memory cells arranged in each row are connected to the sense amplifier through the pair of true and complementary bit lines to be located on both sides of the sense amplifier and the pair of dummy memory cells for each row are connected to the sense amplifier through the pair of true and complementary bit lines to be located on both sides of the sense amplifier respectively. The memory cells in each column are connected to a word line and the pair of dummy memory cells in each row are connected to respective dummy word line. A column decoder is connected to all the word lines and dummy word lines and responsive to an address signal externally applied thereto to select one of the word lines and one of the dummy word lines as determined by the address signal. A word line-drive generator connected to the column decoder is also responsive to that address signal to generate and apply a word line-drive signal to the selected word line and dummy word line through the column decoder to develop potentials thereon until the mating memory cells are turned on with the result that the electric charges on the memory capacitors in the now turned-on memory cells are read on the associated pair of true and complementary bit lines. In order to activate the sense amplifier for each row, an activation circuit is connected to the pair of dummy word lines and the sense amplifier for that row to generate and supply an activating signal to the sense amplifier when the electric charges on the memory capacitors are properly read out on the associated pair of the true and complementary bit lines. When activated, the sense amplifier amplifies a potential difference between potentials developed on those bit lines due to the reading of the electric charges.

BRIEF DESCRIPTION OF THE DRAWING

The present invention will become more readily apparent from the following detailed description taken in conjunction with the accompanying drawing in which.

DESCRIPTION OF THE PREFERRED EMBODIMENT

Figure 1:
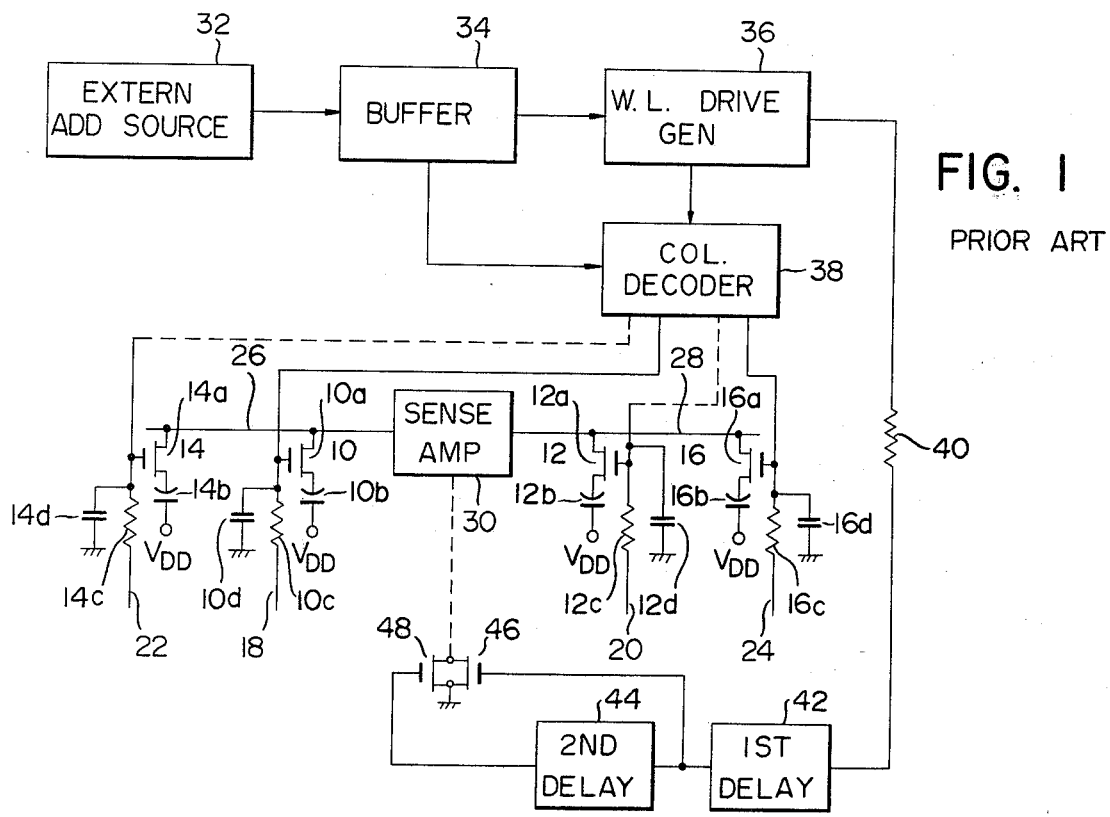
FIG. 1 is a combined block and circuit diagram of one portion of a conventional memory circuit.

Referring now to FIG. 1 of the drawing, there is illustrated a conventional memory circuit. The arrangement illustrated comprises a pair of single transistor type memory cells 10 and 12 and a pair of dummy memory cells 14 and 16. Those memory cells 10, 12, 14 and 16 are similar in construction to one another, and one of the memory cells, for example, the memory cell 10 will now be described. The memory cell 10 includes a field effect transistor 10a and a capacitor 10b connected between the transistor 10a and a drain supply voltage $V_{DD}$. The field effect transistor 10a includes a gate electrode shown in FIG. 1 as being connected to a parasitic resistance 10c and a parasitic capacitance 10d subsequently connected to ground. Each of the remaining transistors includes the components similar to those described above and designated by the reference numeral denoting the associated memory cell and suffixed with the reference characters a, b, c and d identifying the components. For example, the reference numeral and character 14a designates the field effect transistor included in the dummy memory cell 14.

The gate electrodes of the transistors 10a and 12a are connected to word lines 18 and 20 through the abovementioned parasitic resistances 10c and 12d respectively while the gate electrodes of the transistors 14a and 16a are connected to dummy word lines 22 and 24 through the abovementioned parasitic resistances 14c and 14d respectively.

The transistors 10a and 14a include respective drain electrodes connected to a true bit line (which is simply called hereinafter a "bit line") 26 and source electrodes connected to the associated capacitors 10b and 14b respectively while the transistors 12a and 16a includes respective drain electrodes connected to a complementary bit lines (which is designated hereinafter by a "bit line") 28 and source electrodes connected to the capacitors 12b and 16b respectively. The bit line 26 and the bit line 28 are connected to a sense amplifier 30.

Thus it is seen that the memory cells 10 and 12 and the dummy memory cells 14 and 16 are connected in symmetrical relationship to the sense amplifier 30 through the bit and bit lines 26 and 28 respectively.

As shown in FIG. 1, an external address source 32 is connected to a buffer circuit 34 subsequently connected to both a word line-drive generator 36 and a column decoder 38. The word line-drive generator 36 is also connected to the column decoder 38 which is, in turn, connected to both the word lines 22 and 24 and the dummy word lines 26 and 28 and therefore to the gate electrodes of all the transistors 10a, 12a, 14a and 16a.

Further the word line-drive generator 36 is connected to a series combination of a resistor 40, a first delay circuit 42 and a second delay circuit 44. The first and second delay circuits 42 and 44 respectively are connected to gate electrodes of two field effect transistors 46 and 48 respectively including drain electrodes connected together to the sense amplifier 30 and source electrodes connected together to ground.

It is to be noted that in FIG. 1 shows the components for a single row except for a few components with omitting the required number of the memory cells such as the cells 10 or 12 connected to each of the bit and bit lines 26 or 28 after the dummy memory cell 14 or 16 and associated word lines only for purposes of illustration. Actually the memory circuit shown in FIG. 1 comprises a plurality of replicas of the components for the single row as illustrated in FIG. 1 disposed in rows one for each row. More specifically, those memory cells arranged in each column are connected in parallel circuit relationship to one word line such as the word line 18 or 20 and have a common X address. Further these memory cells arranged in each row are located on either side of the associated sense amplifier such as the sense amplifier 30 and connected to the latter through the mating bit or bit line such as the line 26 or 28 with a Y address common thereto. Also one pair of dummy memory cells arranged in each row are located on both sides of the associated sense amplifier and connected to the latter through the mating bit and bit lines respectively. In addition, each row includes an activation circuit formed of the components similar to the components 42 through 48 and connected between the pair of dummy word lines and the sense amplifier.

Assuming that all the field effect transistors are of the n channel MOS type, the operation of the arrangement shown in FIG. 1 will now be described. An address signal from the address source 32 is externally applied via the buffer circuit 34 to both the generator circuit 36 and the column decoder 38. The column decoder 38 responds to the applied address signal to select the word and dummy word lines as determined by the address signal. That is, the address signal selects the word line associated with one of the bit line 26 and the bit line 28 and the dummy word line located on that side of the sense amplifier 30 remote from the selected word line. In the example illustrated, the word line 18 and the dummy word line 24 have been selected so shown at solid leads extending from the row decoder 38 in FIG. 1. It is also assumed that the address signal selects the row shown in FIG. 1. On the other hand, the generator word line-drive 36 generates a signal for driving a word line in response to the applied address signal.

The word line 18 and the dummy word line 24 thus selected are charged with the signal applied thereto through the column decoder 48 from the generator 36 and increased in potential. When the potentials on the word line 18 and the dummy word line 24 reach sufficient levels, the transistors 10a and 16a are turned on with the result that data or electric charges stored on the capacitors 10b and 16b are read out on the bit line 26 and the bit line 28 respectively.

When the data or electric charges on the capacitors 10b and 16b have been sufficiently read out on the bit line 26 and the bit line 28 respectively, the word line-drive signal generated from the generator 36 passes through the resistor 40 and the first delay circuit 42 after which a part of the signal enters the transistor 46 and the remaining part thereof enters the transistor 48 through the second delay circuit 44. Then the signal from the transistors 46 and 48 is supplied to the sense amplifier 30 to activate the latter. Therefore the sense amplifier 30 amplifies a potential difference between the bit line 26 and the bit line 28.

When the word line 20 and the dummy word line 22 are selected, the process as described above is repeated to activate similarly the sense amplifier circuit 30.

The foregoing is equally applied to the remaining rows.

In the process of that amplification the word line-drive signal is operative to raise the potentials in the selected word line 18 and the dummy word line 24 as described above. At that time, the rise of the potential on each line is fairly delayed with respect to that of the word line-drive signal and has a gentle slope as compared with the latter signal. This is because each of the word lines and the dummy word lines such as lines 18 or 24 is operatively coupled to the parasitic resistance and capacitance such as designated by 10c, 16c, 10d or 16d having high magnitudes. As a result, it is difficult to determine the level at which the data or electric charges on the memory capacitor 10b and the dummy memory capacitor 16b are read out on the bit line 26 and the bit line 28 respectively.

In order to avoid this difficulty, it has been previously required to optimize a timing of activation of the sense amplifier 30. To this end, various attempts have been heretofore proposed to delay the timing of actuation of the sense amplifier with respect to the word line-drive signal. For example, the resistor 40 has been artificially prepared to be similar to the parasitic resistances 10c, 12c, 14c and 16c and connected between the word line-drive generator 36 and the first delay circuit 42 as shown in FIG. 1 without or with a capacitor artificially prepared to be similar to the parasitic capacitances 10d, 12d, 14d and 16d. Alternatively, the delay circuits 42 and 44 have been required to be strictly designed and constructed in order to permit only those two delay circuits to control the timing for activating the sense amplifier. This has been inevitably attended with the strict circuit simulation. Therefore it has been difficult to design and construct circuit means for delaying the word line-drive signal by the two delay circuits 40 and 42 alone without the resistor 40.

Also conventional memory circuits such as shown in FIG. 1 have been disadvantageous in that the required semiconductor chip is large in size and the memory circuits are easily affected by a variation in manufacturing process. More specifically, when the manufacturing process is varied, the resulting influence upon the rise of the potentials on the word lines 22 and 24 and the dummy word lines 26 and 28 may be different from that upon the delay circuits 42 and 44 with a high probability. This will lead to a reduction in yield.

The present invention contemplates to eliminate the disadvantages of the prior art practice as described above by utilizing a rise of a potential in a dummy word line or a word line in order to generate an activating signal for activating an sense amplifier involved.

Figure 2:
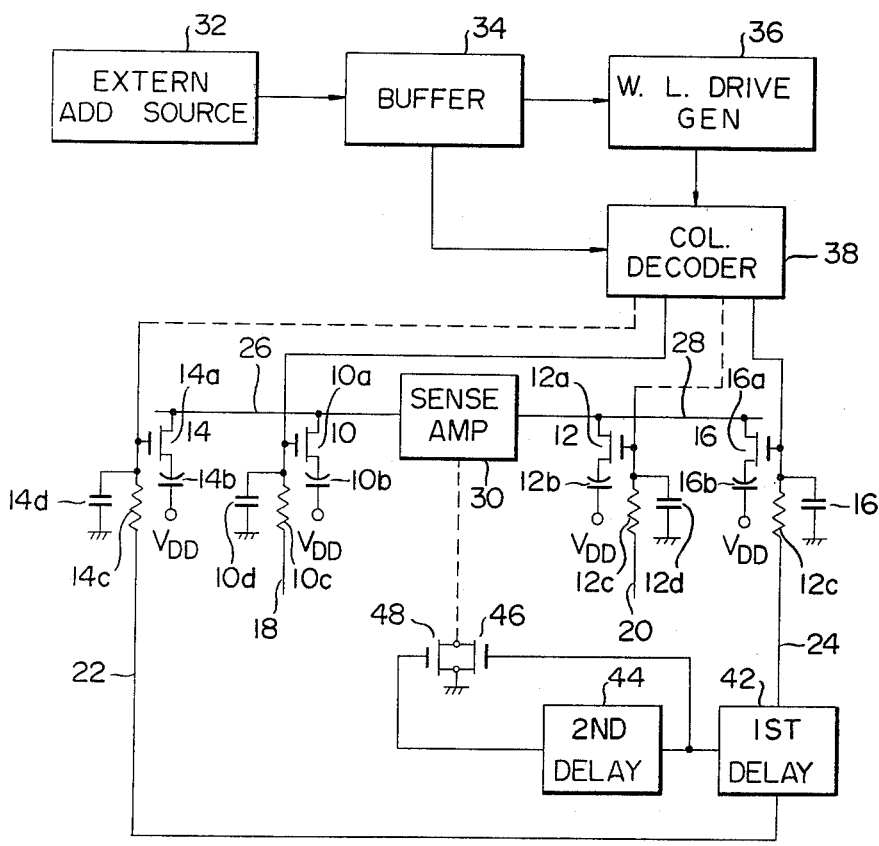
FIG. 2 is a combined block and circuit diagram of one portion of one embodiment according to the memory circuit of the present invention.

Referring now to FIG. 2 wherein like reference numerals designate the components identical or corresponding to those shown in FIG. 1, there is illustrated one embodiment according to the memory circuit of the present invention. In the arrangement illustrated the first delay circuit 42 is directly connected to the dummy word lines 22 and 24 but not to the word line-drive generator 36 through the resistor 40 as shown in FIG. 1 and for each of the remaining rows. A pair of dummy word lines are connected to the bit and $\overline{bit}$ lines through the associated dummy memory cells respectively and also across the column decoder 38 and a mating first delay circuit such as the delay circuit 42 although such dummy word lines and delay circuit are not illustrated.

The column decoder 38 responds to an applied address signal to select the word line and dummy word lines connected via the associated dummy memory cells to those bit lines not connected to the selected word line through the associated memory cell. The word line-drive generator 36 responds to the same address signal to apply a signal to the selected word line and also to the selected dummy word line as determined by the address signal. Therefore the selected word line and dummy word line increase in potential to be connected to the associated bit lines, for example, the lines 26 and 28 through the mating transistors turned on as in the arrangement of FIG. 1.

Therefore address means is formed of the word line-drive generator 36, the column decoder 38, the word lines such as word lines 12 and 20 and dummy word lines such as dummy word lines 22 and 24.

In other respects the arrangement is substantially similar to that shown in FIG. 1.

Therefore, when the rise of the potential on the selected dummy word line 24 including the high parasitic resistance and capacitance is slow and fairly delayed with respect to that of the word line-drive signal, the signal actually developed on the dummy word line 24 is passed through the delay circuits 40 and 42 where its rise is delayed. The signal with the rise thus delayed is supplied via the parallel transistors 44 and 46 to the sense amplifier 30 as an activating signal. This measure permits the sense amplifier 30 to be activated at a time point where the electric charges or data stored on the capacitors 10b and 16b are properly read out on the bit line 26 and the $\overline{bit}$ line 28 respectively.

The present invention has several advantages. For example, the resulting density of integration can be high because the resistor 40 previously required is omitted and the delay circuits can be easily designed and constructed. Also any variation in manufacturing process will not change the temporal relationship among various signals developed in the memory circuit. Accordingly, there is provided a memory circuit free from the influence due to a variation in manufacturing process, decreased in area of the particular semiconductor chip and reliable in operation.

While the present invention has been illustrated and described in conjunction with a single preferred embodiment thereof it is to be understood that numerous changes and modifications may be resorted to without departing from the spirit and scope of the present invention. For example, the first delay circuit 42 may be connected to the word lines 18 and 20 but not to the dummy word lines 22 and 24 because in the arrangement of FIG. 2, the word lines 18 and 20 can readily be designed and constructed to be equal in the rise of potentials to the dummy word lines 22 and 24. Also the present invention is equally applicable to memory circuits including the field effect transistor of the type other than the n channel MOS type, for example, the p channel MOS type, the complementary MOS type or the like.

What we claim is:

1. A memory circuit comprising a plurality of single transistor type memory cells arranged in rows and columns, each of said memory cells including a memory capacitor having an electric charge stored thereon; a pair of dummy memory cells identical in construction to said memory cells for each row; a sense amplifier for each row; a pair of true and complementary bit lines connected to said sense amplifier for each row; the memory cells arranged in each row being connected to said sense amplifier through said pair of true and complementary bit lines to be located on both sides of said sense amplifier; said pair of dummy memory cells for each row being connected to said sense amplifier through said pair of true and complementary bit lines to be located on both sides of said sense amplifier respectively; address means including a plurality of word lines each connected to the memory cells arranged in each column, a pair of dummy word lines connected to said dummy memory cells respectively for each row, a column decoder connected to all said word lines and dummy word lines and responsive to an address signal externally applied thereto to select both one of said word lines and one of said dummy word lines as determined by said address signal, and a word line-drive generator connected to said column decoder and responsve to said address signal also externally applied thereto generate and supply a word line-drive signal to said selected word line and dummy word line through said column decoder to develop potentials thereon to effect the turn-on of the memory cell and the dummy memory cell connected to said selected word line and dummy word line respectively thereby to cause said electric charges on said memory capacitor in said turned-on memory cell and dummy memory cell to be read out on an associated pair of said true and complementary bit lines respectively; and activation means for each row connected to said pair of dummy word lines for said row and also to said sense amplifier for said row to generate and supply an activating signal to said sense amplifier to activate the latter when said electric charges on said memory capacitor are properly read out on the lastmentioned pair of said true and complementary bit lines; said sense amplifier, as activated, amplifying a potential difference between potentials developed on said pair of true and complementary bit lines due to the reading of said electric charges.

2. A memory circuit as claimed in claim 1 wherein said activation means includes delay circuit means connected to said pair of dummy word lines and coupled to said sense amplifier to delay said potential developed on said selected dummy word line means to form said activating signal.

* * * * *